(12) United States Patent
Fiseni et al.

(10) Patent No.: US 11,471,911 B2
(45) Date of Patent: Oct. 18, 2022

(54) PHASED ARRAY ULTRASONIC TRANSDUCER AND METHOD OF MANUFACTURE

(71) Applicant: General Electric Company, Schenectady, NY (US)

(72) Inventors: Alexander Felix Fiseni, Cologne (DE); Matthew Harvey Krohn, Reedsville, PA (US); Stephan Falter, Simmerath (DE); Sven Runte, Grevenbroich (DE)

(73) Assignee: BAKER HUGHES, A GE COMPANY, LLC, Houston, TX (US)

( * ) Notice: Subject to any disclaimer, the term of this patent is extended or adjusted under 35 U.S.C. 154(b) by 568 days.

(21) Appl. No.: 15/595,122

(22) Filed: May 15, 2017

(65) Prior Publication Data

US 2017/0326592 A1 Nov. 16, 2017

Related U.S. Application Data

(60) Provisional application No. 62/337,075, filed on May 16, 2016.

(51) Int. Cl.
  *B06B 1/06* (2006.01)
  *H05K 3/32* (2006.01)
  (Continued)

(52) U.S. Cl.
  CPC .......... *B06B 1/0622* (2013.01); *B06B 1/0607* (2013.01); *G01N 29/04* (2013.01);
  (Continued)

(58) Field of Classification Search
  CPC ....... B06B 1/0622; B06B 1/0607; B06B 1/06; B06B 1/0603
  (Continued)

(56) References Cited

U.S. PATENT DOCUMENTS 9,035,532 B2   5/2015   Chowdhury
2004/0123666 A1   7/2004   Ao et al.
(Continued)

FOREIGN PATENT DOCUMENTS

WO   2014118383 A2   8/2014

OTHER PUBLICATIONS

Wagle, S. et al., "Ultrasonic properties of all-printed piezoelectric polymer transducers," Applied Physics Letters 103, 262902 (2013), 6 pps.

*Primary Examiner* — Derek J Rosenau
(74) *Attorney, Agent, or Firm* — Mintz Levin Cohn Ferris Glovsky and Popeo, PC; Lisa Adams (57) ABSTRACT

A phased array ultrasonic transducer includes a bonding wire structure, a damping material, a plurality of ultrasonic transducers, and a printed circuit board. The bonding wire structure includes a plurality of bonding wire elements. The damping material surrounds the bonding wire structure and is interposed with the plurality of bonding wire elements. The plurality of ultrasonic transducers is arranged in a matrix beneath a membrane, each of the plurality of ultrasonic transducers being coupled to a corresponding bonding wire element of the plurality of bonding wire elements. The printed circuit board includes a plurality of circuits. Each of the plurality of circuits is coupled to a corresponding bonding wire element of the plurality of bonding wire elements.

12 Claims, 7 Drawing Sheets

(51) Int. Cl.
*G01N 29/32* (2006.01)
*G01N 29/04* (2006.01)
*G10K 11/00* (2006.01)
*G01N 29/26* (2006.01)

(52) U.S. Cl.
CPC ........... *G01N 29/262* (2013.01); *G01N 29/32* (2013.01); *G10K 11/002* (2013.01); *H05K 3/32* (2013.01); *G01N 2291/106* (2013.01)

(58) Field of Classification Search
USPC ........................................ 310/322, 334, 335
See application file for complete search history.

(56) References Cited

U.S. PATENT DOCUMENTS

| | | |
|---|---|---|
| 2007/0189761 A1 | 8/2007 | Sudol |
| 2008/0242984 A1* | 10/2008 | Oakley ................ G10K 11/002 600/442 |
| 2010/0025785 A1* | 2/2010 | Robinson .............. B06B 1/0622 257/416 |
| 2010/0317972 A1* | 12/2010 | Baumgartner ....... A61B 8/4483 600/459 |
| 2011/0295124 A1* | 12/2011 | Shikata ................... B06B 1/064 600/459 |
| 2011/0316387 A1* | 12/2011 | Togasaki ............... B06B 1/0622 310/334 |
| 2012/0095347 A1 | 4/2012 | Adam et al. |

* cited by examiner

PHASED ARRAY ULTRASONIC TRANSDUCER AND METHOD OF MANUFACTURE

PRIORITY

This application claims priority to U.S. Provisional Application No. 62/337,075 filed on May 16, 2016, entitled "PHASED ARRAY ULTRASONIC TRANSDUCER AND METHOD OF MANUFACTURE," which is hereby incorporated by reference herein.

TECHNICAL FIELD

The field of the disclosure relates generally to phased array ultrasonic transducers and, more particularly, to a phased array transducer with integrated bonding wire structure and a method of manufacture.

BACKGROUND

In some present ultrasonic transducers, electrical energy is converted into ultrasonic waves, i.e., above 18 kilohertz (kHz), and vice versa. Ultrasonic transducers are sometimes referred to as ultrasonic transmitters, receivers, or transceivers, depending on their application. An ultrasonic transducer can include a membrane that oscillates in response to an alternating current (AC) signal applied to the ultrasonic transducer, or in response to a received ultrasonic signal. When transmitting, the membrane oscillates to produce an ultrasonic wave that propagates away from the membrane. When receiving, the membrane oscillates in a measurable manner, producing an AC signal in the ultrasonic transducer.

Ultrasonic transducers are used in many fields for testing. For example, in medical fields, ultrasonic transducers are used for medical imaging. In other fields, ultrasonic transducers are used for nondestructive testing. Generally, ultrasonic transducers transmit an ultrasonic wave into an object. As the ultrasonic wave propagates through and reaches various features of the object, the ultrasonic wave can be partially reflected. The ultrasonic transducer detects the reflections. The reflections are interpreted based on the transmitted ultrasonic wave and the lapsed time between the transmission and receiving the reflections to analyze certain features of the object. Testing systems utilizing ultrasonic transducers can produce images, graphic displays, or measurements from the collected data.

Single-element ultrasonic transducers can produce an ultrasonic wave characterized by its wavelength and its beam width, and propagating in a single direction. In some instances, ultrasonic testing, single-element ultrasonic transducers offer limited utility, because of their narrow unidirectional beam. In such instances, single-element ultrasonic transducers may be physically scanned, moved, or turned to sweep the ultrasonic beam over the area of the object being tested. In some instances, multiple ultrasonic transducers can be arranged in a phased array. Phased array arrangements vary widely according to their application, arrangements including one-dimensional (1-D) arrays, two-dimensional (2-D) arrays, and three-dimensional (3-D) arrays. Phased array ultrasonic transducers can facilitate electronically sweeping the ultrasonic beam over the area of the object being tested. Each ultrasonic transducer in the phased array can be individually controlled in amplitude, frequency, and phase, allowing the phased array ultrasonic transducer to produce a directed ultrasonic beam that can be electronically swept over the area of the object being tested.

During operation, the ultrasonic energy emitted by the phased array ultrasonic transducer can be generally concentrated in the main beam. However, some amount of ultrasonic energy can be emitted in other, less desirable directions. Some conventional ultrasonic transducers and phased array ultrasonic transducers are manufactured such that the transducer membrane is in direct contact with a printed circuit board (PCB). The PCB includes an integrated circuit (IC) that carries the AC signals to and from each ultrasonic transducer in the phased array. Certain phased arrays require multiple PCB layers to provide sufficient contacts for the numerous ultrasonic transducers. Consequently, the PCB may absorb at least some of the undesired ultrasonic energy, reducing performance of the PCB itself and the phased array ultrasonic transducer.

BRIEF DESCRIPTION

In one aspect, a phased array ultrasonic transducer includes a bonding wire structure, a damping material, a plurality of ultrasonic transducers, and a printed circuit board. The bonding wire structure includes a plurality of bonding wire elements. The damping material surrounds the bonding wire structure and is interposed with the plurality of bonding wire elements. The plurality of ultrasonic transducers is arranged in a matrix beneath a membrane, each of the plurality of ultrasonic transducers being coupled to a corresponding bonding wire element of the plurality of bonding wire elements. The printed circuit board includes a plurality of circuits. Each of the plurality of circuits is coupled to a corresponding bonding wire element of the plurality of bonding wire elements.

In another aspect, a method of manufacturing a phased array ultrasonic transducer is provided. The method includes forming a bonding wire structure of conductive material. The bonding wire structure includes a plurality of bonding wire elements arranged in a grid and coupled to a structural base. The method further includes positioning a damping material surrounding and interposed with the plurality of bonding wire elements. The damping material defines a first face that is substantially parallel to the grid and a second face that is opposite the first face. The method further includes trimming the structural base from the phased array ultrasonic transducer.

In yet another aspect a phased array ultrasonic transducer is provided. The phased array ultrasonic transducer includes a bonding wire structure, a damping material, a plurality of ultrasonic transducers, and a printed circuit board. The bonding wire structure includes a plurality of bonding wire elements formed by sequentially depositing a conductive material in layers on a structural base. The plurality of bonding wire elements is arranged in a grid. The damping material extends across the bonding wire structure to surround the bonding wire structure. The damping material is interposed with the plurality of bonding wire elements. The damping material defines a first face that is substantially parallel to the grid of bonding wire elements. The plurality of ultrasonic transducers is arranged in a matrix beneath a membrane. Each of the plurality of ultrasonic transducers is coupled to a corresponding bonding wire element of the plurality of bonding wire elements. The membrane is laminated to the first face of the damping material. The printed circuit board includes a plurality of circuits, where each of the plurality of circuits is coupled to a corresponding bonding wire element of the plurality of bonding wire elements.

The printed circuit board is laminated to a second face of the damping material, the second face defined opposite the first face.

DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of this disclosure. These features are believed to be applicable in a wide variety of systems comprising one or more embodiments of this disclosure. As such, the drawings are not meant to include all conventional features known by those of ordinary skill in the art to be required for the practice of the embodiments disclosed herein.

DETAILED DESCRIPTION

The present disclosure describes ultrasonic transducers and techniques for manufacturing a phased array ultrasonic transducer with integrated bonding wire. Ultrasonic transducers can be mounted indirectly to or directly to a printed circuit board that drives the ultrasonic transducers, which can expose the printed circuit board to some amount of ultrasonic energy during operation. As described more fully below, some embodiments of the present disclosure provide a bonding wire structure that connects the ultrasonic transducer to the printed circuit board. The bonding wire structure can be surrounded by an ultrasonic damping material that reduces the amount of ultrasonic energy that reaches the printed circuit board. Such a bonding wire structure and damping material may be manufactured using additive manufacturing techniques. For example, a bonding wire structure can be 3D-printed using a conductive material. A resin-based damping material is then applied to the bonding wire structure and cured, resulting in an integrated bonding wire structure. The integrated bonding wire structure can then be trimmed and mounted between ultrasonic transducers and a printed circuit board. Other embodiments are within the scope of the present disclosure.

Embodiments of the present disclosure relate to phased array ultrasonic transducers. More specifically, the phased array ultrasonic transducers described herein include an integrated bonding wire structure that can couple the ultrasonic transducers to a printed circuit board. The bonding wire structure may be manufactured by additive manufacturing techniques, sequentially depositing layers of a conductive material to form multiple bonding wire elements on top of a structural base. A damping material is then added to the bonding wire structure and cured. The damping material can be trimmed to design dimensions, including removal of the structural base for the bonding wire structure. The membrane for the ultrasonic transducers may be laminated on a first face of the damping material, and a printed circuit board can be laminated to an opposite face.

Figure 1:
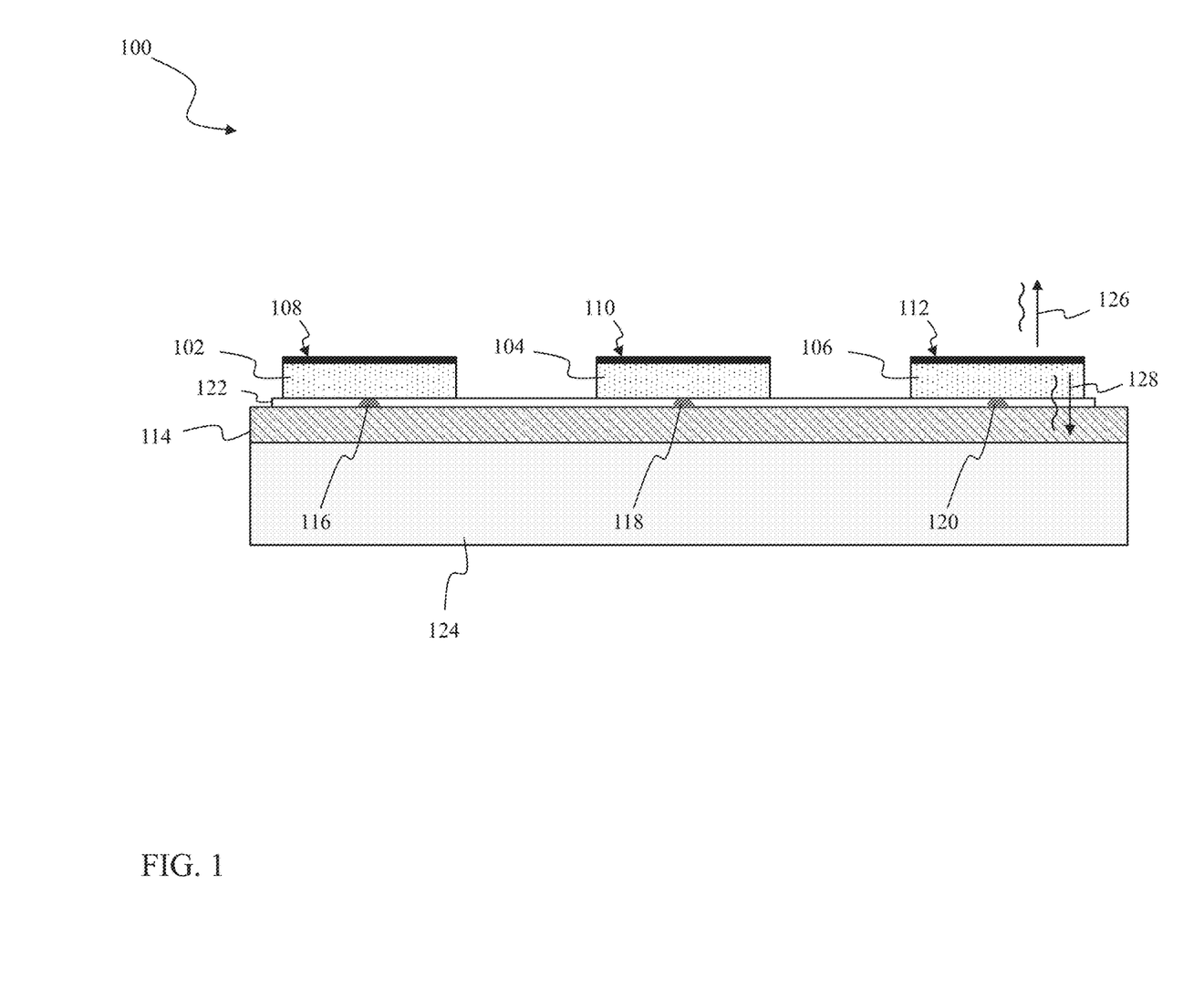
FIG. 1 is a cross-sectional diagram of a conventional phased array ultrasonic transducer.

FIG. 1 is a cross-sectional diagram of an embodiment of a conventional phased array ultrasonic transducer 100. Phased array ultrasonic transducer 100 can include transducers 102, 104, and 106. Phased array ultrasonic transducer 100 may include additional or fewer transducers (not shown), however, for clarity, FIG. 1 illustrates only a portion of phased array ultrasonic transducer 100. Transducers 102, 104, and 106 can include respective membranes 108, 110, and 112 that oscillate in response to an alternating current (AC) signal applied to transducers 102, 104, and 106, and/or in response to a received ultrasonic wave. Transducers 102, 104, and 106 may be embodied by any suitable ultrasonic transducers, including a piezoelectric transducers and capacitive transducers.

Transducers 102, 104, and 106 can be coupled to a printed circuit board (PCB) 114 through respective contacts 116, 118, and 120. PCB 114 can include multiple circuits (not shown) for carrying signals to and from each of transducers 102, 104, and 106. Voids between each of transducers 102, 104, and 106 and PCB 114 can be filled by a filler material 122. PCB 114 may include a rigid PCB or a flexible PCB, and may further include one or more PCB layers to accommodate the necessary circuits and contacts for transducers 102, 104, and 106.

Phased array ultrasonic transducer 100 can include a damping material 124 fixed to a side, for example, the back side of PCB 114. Properties of damping material 124 further define the operating characteristics of phased array ultrasonic transducer 100, including frequency response and sensitivity. During operation, each of transducers 102, 104, and 106 produces an ultrasonic wave 126 that propagates away from respective membranes 108, 110, and 112. Likewise, some of the generated ultrasonic energy is directed into PCB 114 and damping material 124. Such ultrasonic energy is illustrated as ultrasonic wave 128. Damping material 124 attenuates ultrasonic wave 128.

Figures 2, 3, 4:
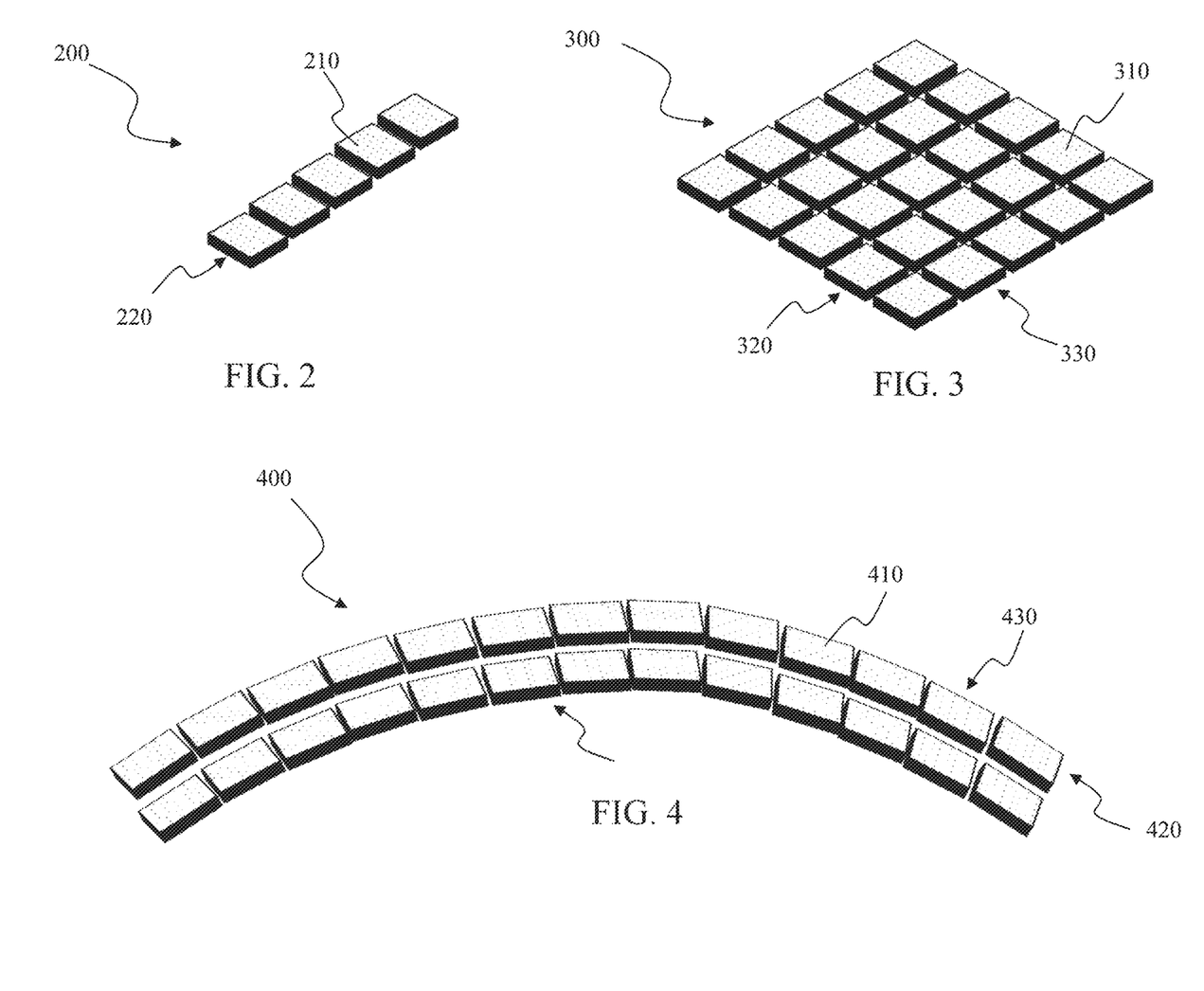
FIG. 2 is a diagram of an exemplary 1-D phased array ultrasonic transducer.
FIG. 3 is a diagram of an exemplary 2-D phased array ultrasonic transducer.
FIG. 4 is a diagram of an exemplary 3-D phased array ultrasonic transducer.

FIG. 2 is a diagram of an exemplary 1-D phased array ultrasonic transducer 200. Phased array ultrasonic transducer 200 includes a plurality of ultrasonic transducers 210 arranged in a row 220. Phased array ultrasonic transducer 200, in certain embodiments, may be formed at least partially by dicing a larger rectangular transducer. During operation, the ultrasonic beam generated by phased array ultrasonic transducer 200 is steerable in a single plane.

FIG. 3 is a diagram of an exemplary 2-D phased array ultrasonic transducer 300. Phased array ultrasonic transducer 300 includes a plurality of ultrasonic transducers 310 arranged in rows 320 and columns 330 to form a grid. During operation, the ultrasonic beam generated by phased array ultrasonic transducer 300 can be steerable in three dimensions.

FIG. 4 is a diagram of an exemplary 3-D phased array ultrasonic transducer 400. Phased array ultrasonic transducer 400 includes a plurality of ultrasonic transducers 410 arranged in rows 420 and columns 430, also forming a grid. Each of rows 420 of ultrasonic transducers 410 is curved, allowing the generated ultrasonic beam to conform to the curve or the geometry of an object being tested. The generated ultrasonic beam is further steerable in three dimensions. In other embodiments, rows 420 of ultrasonic transducers 410 may be curved in one direction and change to another, for example, in an "S" configuration or another shape to enable the ultrasonic beam to conform to the curve or the geometry of the object being tested.

Figure 5:
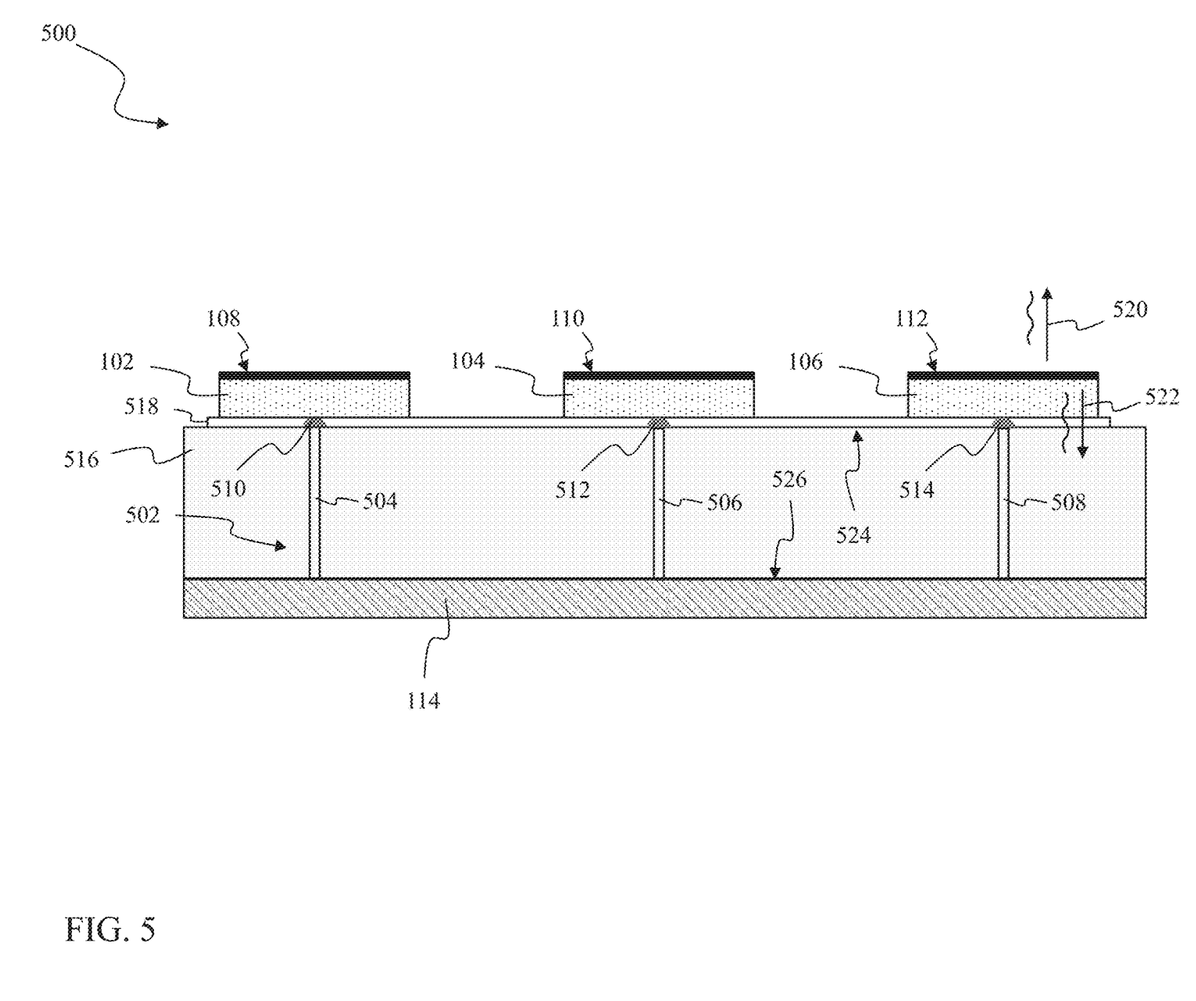
FIG. 5 is a diagram of the exemplary phased array ultrasonic transducer with integrated bonding wire structure.

FIG. 5 is a diagram of the exemplary phased array ultrasonic transducer 500 with an integrated bonding wire structure 502. Integrated bonding wire structure 502 includes a plurality of bonding wire elements 504, 506, and 508 respectively coupled between PCB 114 and transducers 102, 104, and 106. Bonding wire elements 504, 506, and 508 conduct AC signals from PCB 114 to transducers 102, 104, and 106. Transducers 102, 104, and 106 are respectively coupled to bonding wire elements 504, 506, and 508, for instance, through contacts 510, 512, and 514.

In certain embodiments, bonding wire elements 504, 506, and 508 are formed in various shapes. For example, in one embodiment, integrated bonding wire structure 502 includes a plurality of conductive cones, where the broad end is coupled to a transducer, such as transducers 102, 104, and 106, and the narrow end is coupled to a PCB, such as, for example, PCB 114. In another embodiment, integrated bonding wire structure 502 includes a plurality of conductive cylinders.

Phased array ultrasonic transducer 500 can include a damping material 516 that surrounds and is interposed with bonding wire elements 504, 506, and 508. Voids between each of transducers 102, 104, and 106 and damping material 516 can be filled by a filler material 518. During operation, each of transducers 102, 104, and 106 may produce an ultrasonic wave 520 that propagates away from respective membranes 108, 110, and 112. Likewise, some of the generated ultrasonic energy may be directed into damping material 516, where it is attenuated before reaching PCB 114. Such ultrasonic energy is illustrated as ultrasonic wave 522. Damping material 516 defines a first face 524 to which transducers 102, 104, and 106 may be coupled. Damping material 516 further defines a second face 526. PCB 114 can be coupled to second face 526. Phased array ultrasonic transducer 500 includes first face 524 and second face 526 that can be positioned opposite first face 524. In alternative embodiments, first face 524 and second face 526 may be configured otherwise. For example, second face 526 may be orthogonal and adjacent to first face 524.

Figure 6:
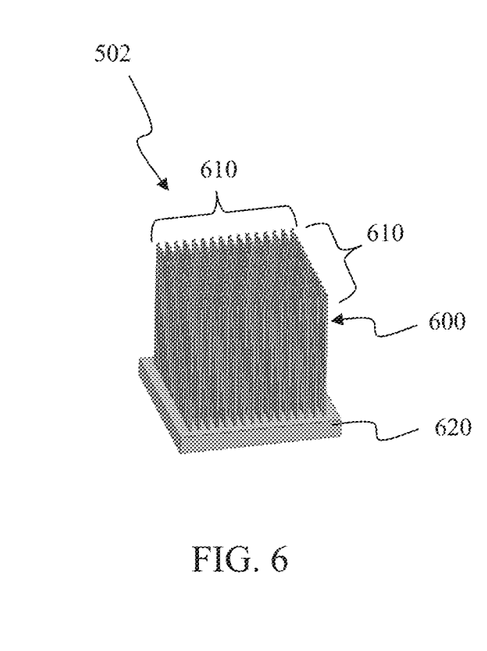
FIG. 6 is a perspective diagram of an exemplary 3D-printed integrated bonding wire structure for the phased array ultrasonic transducer shown in FIG. 5.

FIG. 6 is a perspective diagram of an exemplary 3D-printed integrated bonding wire structure 502 for phased array ultrasonic transducer 500 (shown in FIG. 5). Integrated bonding wire structure 502 is composed of a conductive material, such as, for example, and without limitation, copper, tin, aluminum, tungsten, or gold. Integrated bonding wire structure 502 includes a plurality of bonding wire elements 600 arranged in a grid 610. Grid 610 may have any suitable spacing for a given application. For example, in one embodiment, bonding wire elements 600 are arranged on a 1 millimeter (mm) grid. In another embodiment, for example, bonding wire elements 600 are arranged on a 0.5 mm grid.

In some embodiments, each of bonding wire elements 600, such as bonding wire elements 504, 506, and 508 (shown in FIG. 5) is configured to couple an ultrasonic transducer to a PCB, such as PCB 114 (shown in FIGS. 1 and 5). In other embodiment, one or more bonding wire elements are configured to couple with an ultrasonic transducer PCB, such as PCB 114. Bonding wire elements 600 each may include a conductive column extending from a structural base 620. Integrated bonding wire structure 502 is at least partially formed using an additive manufacturing technique, sometimes referred to as 3D printing. More specifically, integrated bonding wire structure 502 is formed by depositing sequential layers of conductive material to form each of bonding wire elements 600. Such techniques include, for example, and without limitation, metal powder injection, fused deposition modeling, fused filament fabrication, robocasting, stereolithography, digital light processing, powder bed and inkjet head 3D printing, electron beam melting, selective laser melting, selective heat sintering, selective laser sintering, direct metal laser sintering, laminated object manufacturing, directed energy deposition, and electron beam freeform fabrication. The conductive material can be deposited in layers until a desired length of the conductive columns is reached. In certain embodiments, the conductive column length is 15 mm. The length of the conductive columns may vary based on the application of phased array ultrasonic transducer 500. The shape of each of bonding wire elements 600 may also vary based on the application. In certain embodiments, bonding wire elements 600 are round. In alternative embodiments, bonding wire elements 600 may be rectangular, conical, or any other suitable shape. Further, bonding wire elements 600 can be formed to match the geometry of the transducer surface. In certain embodiments, bonding wire elements 600 follow a defined 3-D spline.

Figure 7:
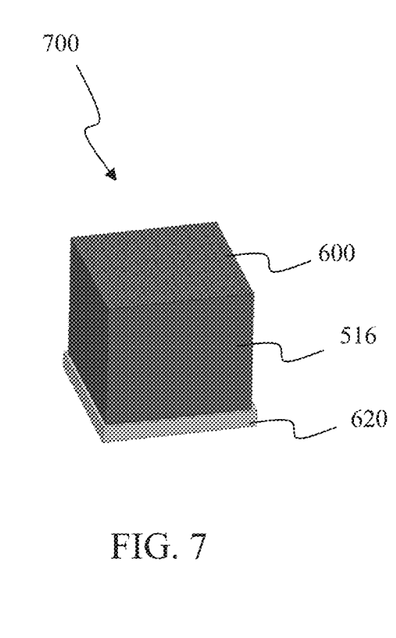
FIG. 7 is a perspective diagram of the integrated bonding wire structure, shown in FIG. 6, with damping material added.

FIG. 7 is a perspective diagram of an exemplary integrated bonding wire structure 700, including damping material 516 and integrated bonding wire structure 502. Damping material 516 can be added to integrated bonding wire structure 502 and can then be cured into a solid. Damping material 516 at least partially surrounds integrated bonding wire structure 502 and is at least partially interposed with bonding wire elements 600. Damping material 516 may include, for example, and without limitation, a resin based material, i.e., a curable resin. When cured, damping material 516 forms a coating that absorbs and attenuates ultrasonic energy. In alternative embodiments, damping material 516 includes, for example, and without limitation, a plastic based material, an injectable material, tungsten powder, carbon powder, and other suitable materials for attenuating ultrasonic energy.

Figure 8:
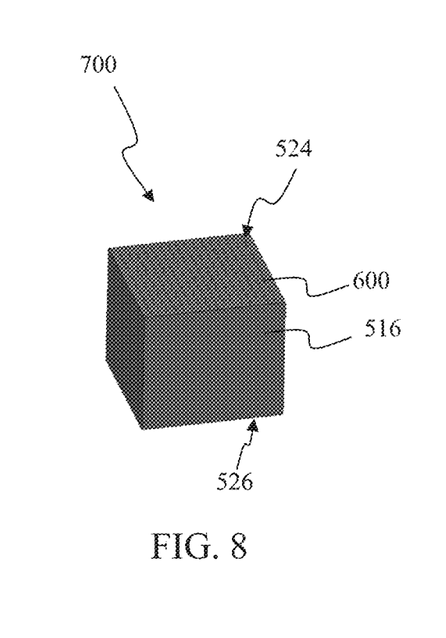
FIG. 8 is a perspective diagram of the integrated bonding wire structure and damping material shown in FIGS. 6 and 7 after trimming to design dimensions.

FIG. 8 is a perspective diagram of an exemplary integrated bonding wire structure 700 (shown in FIG. 7) after trimming to design dimensions. During trimming, structural base 620 (shown in FIGS. 6 and 7) can be removed from second face 526 of damping material 516. Additional, damping material 516 defines first face 524, which can be positioned opposite second face 526. First face 524 can be oriented parallel to grid 610.

Figure 9:
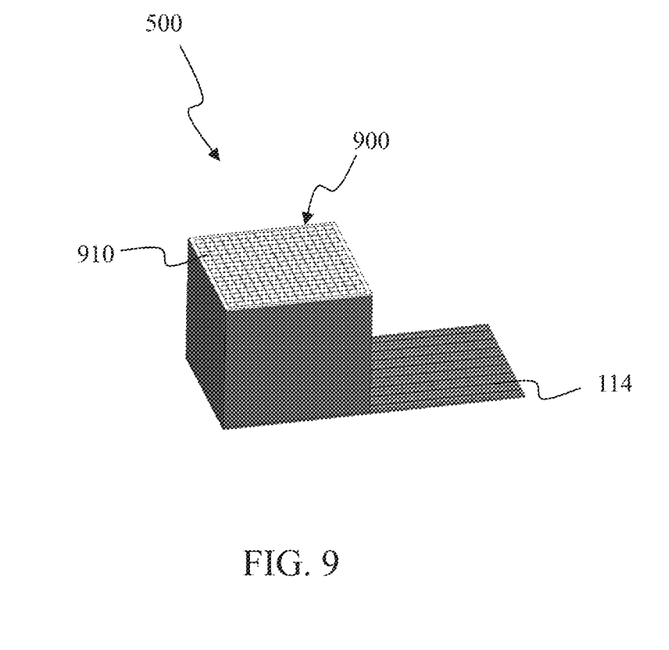
FIG. 9 is a perspective diagram of the trimmed integrated bonding wire structure and damping material, shown in FIG. 8, having a transducer membrane laminate and a PCB laminate.

FIG. 9 is a perspective diagram of an exemplary integrated bonding wire structure 700 (shown in FIGS. 7 and 8), forming phased array ultrasonic transducer 500. FIG. 9 further illustrates a transducer membrane 900 laminated to first face 524 and PCB 114 laminated to second face 526. Beneath transducer membrane 900 are a plurality of ultrasonic transducers 910 arranged in a matrix and respectively coupled to at least one of bonding wire elements 600 of integrated bonding wire structure 502. Likewise, PCB 114 includes a plurality of circuits respectively coupled to opposite ends of at least one of bonding wire elements 600.

Figure 10:
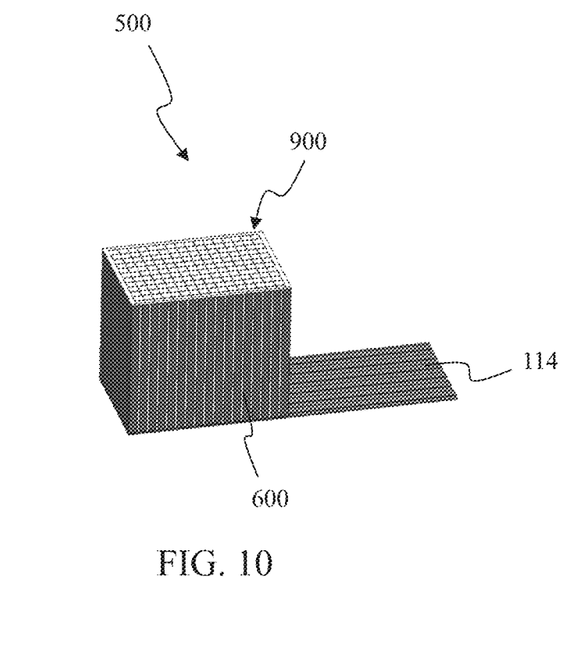
FIG. 10 is a perspective cross-sectional diagram of the phased array ultrasonic transducer shown in FIG. 9.

FIG. 10 is a perspective cross-sectional diagram of an exemplary phased array ultrasonic transducer 500 shown in FIGS. 5 and 9. FIG. 10 illustrates bonding wire elements 600 of integrated bonding wire structure 700 coupling transducer membrane 900 and PCB 114.

Figures 11, 13:
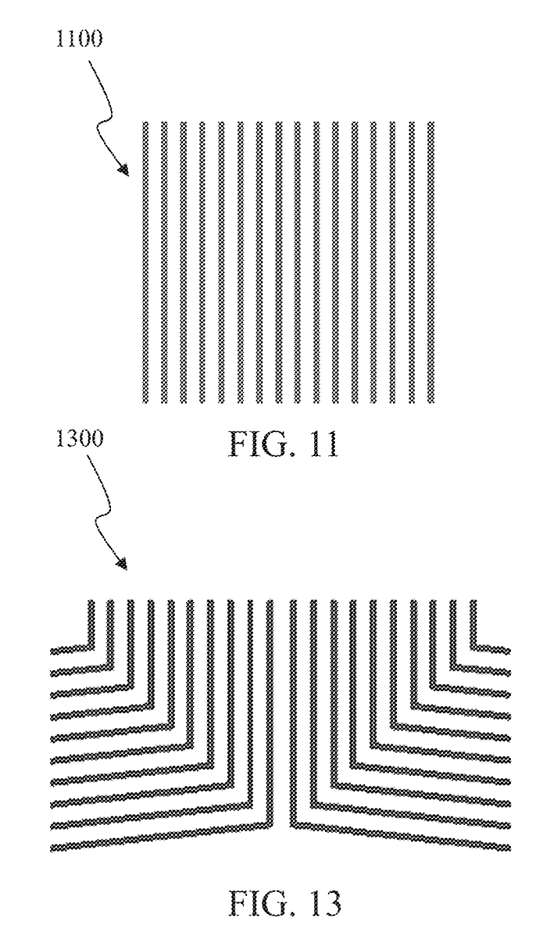
FIG. 11 is a cross-sectional diagram of an exemplary straight bonding wire structure.
FIG. 13 is a cross-sectional diagram of an exemplary 3-D shaped bonding wire structure for a 2-D phased array ultrasonic transducer.
Figures 12, 14:
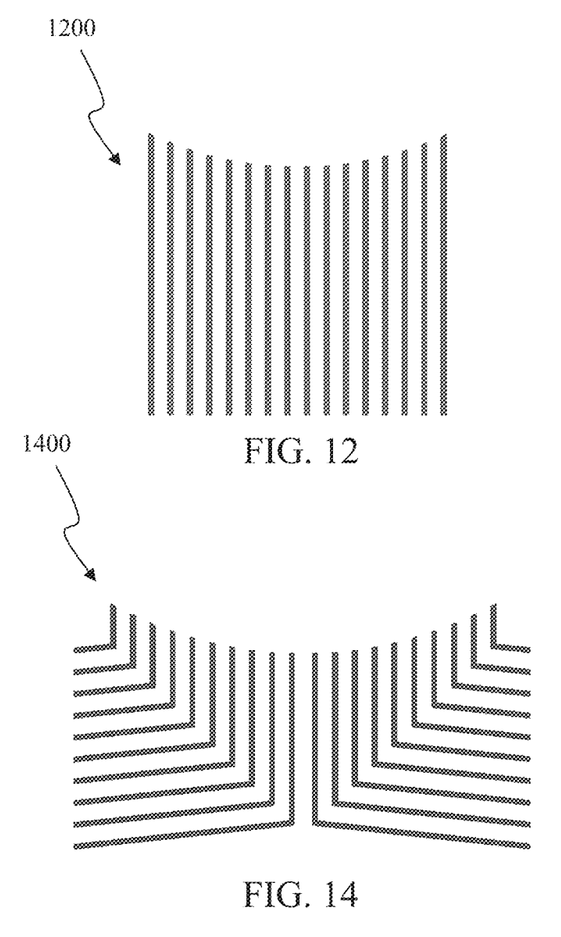
FIG. 12 is a cross-sectional diagram of an exemplary straight bonding wire structure for a curved phased array ultrasonic transducer.
FIG. 14 is a cross-sectional diagram of another exemplary 3-D shaped bonding wire structure for a 3-D phased array ultrasonic transducer.

FIGS. 11-14 illustrate various shapes in which integrated bonding wire structure 502 may be formed. FIG. 11 is a cross-sectional diagram of an exemplary straight bonding wire structure 1100. FIG. 12 is a cross-sectional diagram of an exemplary straight bonding wire structure 1200 for a curved phased array ultrasonic transducer. FIG. 13 is a cross-sectional diagram of an exemplary 3-D shaped bonding wire structure 1300 for a 2-D phased array ultrasonic transducer. FIG. 14 is a cross-sectional diagram of another exemplary 3-D shaped bonding wire structure 1400 for a 3-D phased array ultrasonic transducer. In additional embodiments, other 3-D shaped bonding wire structures may be used.

Figure 15:
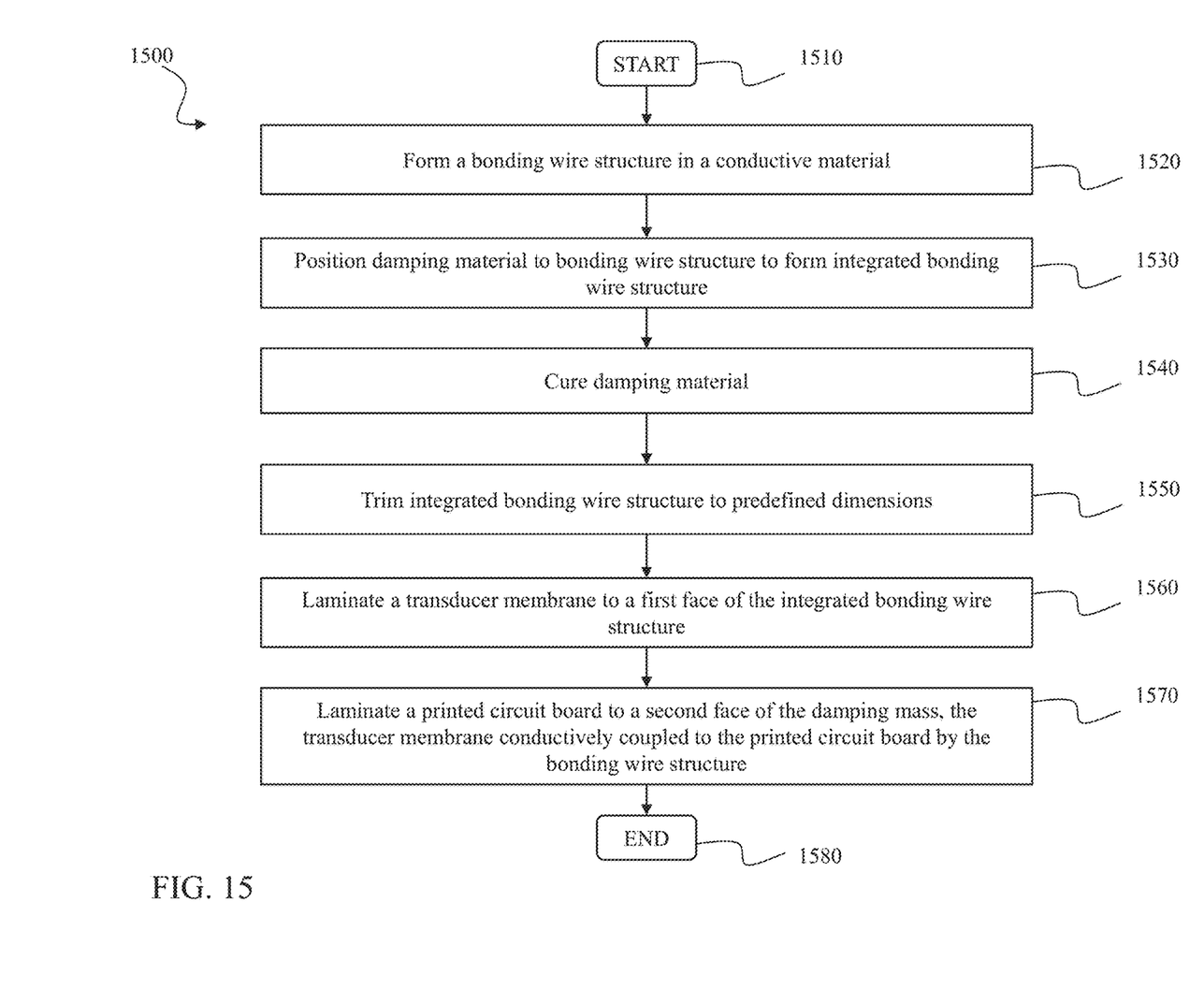
FIG. 15 is a flow diagram of an exemplary method of manufacturing the phased array ultrasonic transducer shown in FIG. 10.

FIG. 15 is a flow diagram of an exemplary method 1500 of manufacturing phased array ultrasonic transducer 500 (shown in FIGS. 5-10). Method 1500 begins at a start step 1510. At an additive manufacturing step 1520, integrated bonding wire structure 502 is formed using a conductive material, such as, for example, copper. Additive manufacturing step 1520 includes, in certain embodiments, sequentially depositing layers of the conductive material to build up a plurality of bonding wire elements 600, or conductive columns on top of structural base 620, for example. Bonding wire elements 600 can be arranged in grid 610.

At a second additive manufacturing step 1530, damping material 516 is added to integrated bonding wire structure 502 to surround bonding wire elements 600, and interposed with bonding wire elements 600. Damping material 516 is then cured at a curing step 1540, forming a solid damping mass and further forming integrated bonding wire structure 700. Damping material 516 can be trimmed at a trimming step 1550 to design dimensions. Trimming step 1550, in certain embodiments, includes removing structural base 620, because each of bonding wire elements 600 are held in place by damping material 516. Trimming step 1550 defines first face 524 of damping material 516 and second face 526 of damping material 516. First face 524 is oriented parallel to grid 610 in which spacing among bonding wire elements 600 is defined. Second face 526 can be positioned opposite first face 524, where structural base 620 initially existed.

At a first lamination step 1560, transducer membrane 900 is laminated to first face 524 of damping material 516. Beneath transducer membrane 900 are a plurality of ultrasonic transducers 910 arranged in a matrix. At least one of ultrasonic transducers 910 is coupled to a corresponding bonding wire element of bonding wire elements 600.

At a second lamination step 1570, PCB 114 is laminated to second face 526 of damping material 516. PCB 114 includes a plurality of circuits for carrying AC signals to corresponding bonding wire elements, and ultimately conductively coupling to ultrasonic transducers 910 through integrated bonding wire structure 502.

The method ends at an end step 1580. In various embodiments of method 1500, one or more of the steps may be omitted, additional steps may be performed, and/or the order of the steps may vary depending upon the application.

In the embodiments of the above described phased array ultrasonic transducers, an integrated bonding wire structure can be included that couples the ultrasonic transducers to a printed circuit board. The bonding wire structure can be manufactured by additive manufacturing techniques, sequentially depositing layers of a conductive material to form multiple bonding wire elements on top of a structural base. A damping material can be added to the bonding wire structure and cured. The damping material can be trimmed to design dimensions, including removal of the structural base for the bonding wire structure. The membrane for the ultrasonic transducers can be laminated on a first face of the damping material, and a printed circuit board is laminated to an opposite face.

Additive manufacturing processes and systems include, for example, and without limitation, vat photopolymerization, powder bed fusion, binder jetting, material jetting, sheet lamination, material extrusion, directed energy deposition and hybrid systems. These processes and systems include, for example, and without limitation, SLA—Stereolithography Apparatus, DLP—Digital Light Processing, 3SP—Scan, Spin, and Selectively Photocure, CLIP—Continuous Liquid Interface Production, SLS—Selective Laser Sintering, DMLS—Direct Metal Laser Sintering, SLM—Selective Laser Melting, EBM—Electron Beam Melting, SHS—Selective Heat Sintering, MJF—Multi-Jet Fusion, 3D Printing, Voxeljet, Polyjet, SCP—Smooth Curvatures Printing, MJM—Multi-Jet Modeling Projet, LOM—Laminated Object Manufacture, SDL—Selective Deposition Lamination, UAM—Ultrasonic Additive Manufacturing, FFF—Fused Filament Fabrication, FDM—Fused Deposition Modeling, LMD—Laser Metal Deposition, LENS—Laser Engineered Net Shaping, DMD—Direct Metal Deposition, Hybrid Systems, and combinations of these processes and systems. These processes and systems may employ, for example, and without limitation, all forms of electromagnetic radiation, heating, sintering, melting, curing, binding, consolidating, pressing, embedding, and combinations thereof.

Additive manufacturing processes and systems employ materials including, for example, and without limitation, polymers, plastics, metals, ceramics, sand, glass, waxes, fibers, biological matter, composites, and hybrids of these materials. These materials may be used in these processes and systems in a variety of forms as appropriate for a given material and the process or system, including, for example, and without limitation, as liquids, solids, powders, sheets, foils, tapes, filaments, pellets, liquids, slurries, wires, atomized, pastes, and combinations of these forms.

An exemplary technical effect of the methods, systems, and apparatus described herein can include at least one of: (a) positioning an ultrasonic damping mass between an ultrasonic transducer membrane and the PCB, (b) reducing ultrasonic energy passing through or absorbed into the PCB, (c) increasing contact density on the PCB for phased array ultrasonic transducers, (d) reducing number of PCB layers necessary for phased array ultrasonic transducers, (e)

improving performance at high ultrasonic frequencies, (f) manufacturing a bonding wire structure integrated within the ultrasonic damping mass, (g) simplifying manufacture of integrated bonding wire structure through use of additive manufacturing techniques to form the bonding wire structure and the damping mass, (h) reducing manufacturing cost for phased array ultrasonic transducers through simplified additive manufacturing, (i) further reducing manufacturing cost for phased array ultrasonic transducers through reduced PCB layers, and (j) improving reliability of phased array ultrasonic transducers through reduced ultrasonic energy imparted on the PCB.

Exemplary embodiments of methods, systems, and apparatus for phased array ultrasonic transducers are not limited to the specific embodiments described herein, but rather, components of systems and/or steps of the methods may be utilized independently and separately from other components and/or steps described herein. For example, the methods may also be used in combination with other non-conventional bonding wire structures, and are not limited to practice with only the systems and methods as described herein. Rather, the exemplary embodiment can be implemented and utilized in connection with many other applications, equipment, and systems that may benefit from reduced cost, reduced complexity, commercial availability, improved reliability at high temperatures, and increased memory capacity.

In the preceding specification and the claims, a number of terms are referenced that have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A phased array ultrasonic transducer comprising:
   a bonding wire structure comprising a plurality of bonding wire elements;
   a damping material surrounding the bonding wire structure and interposed with the plurality of bonding wire elements;
   a plurality of ultrasonic transducers arranged in a matrix, each of said ultrasonic transducers coupled to at least one of said plurality of bonding wire elements by a contact; wherein an entirety of the damping material is positioned below the plurality of ultrasonic transducers;
   a filler material filling voids between the plurality of ultrasonic transducers and the damping material, wherein the filler material includes the contact, such that each of said ultrasonic transducers is directly coupled to at least one of said plurality of bonding wire elements via the contact positioned within the filler material; and
   a printed circuit board comprising a plurality of circuits, each said circuit coupled to a wire element of said plurality of bonding wire elements;
   wherein the damping material is configured to absorb and attenuate ultrasonic energy.

2. The phased array ultrasonic transducer of claim 1, wherein said printed circuit board further comprises a flexible printed circuit board.

3. The phased array ultrasonic transducer of claim 1, wherein each of said plurality of bonding wire elements comprises a conductive column.

4. The phased array ultrasonic transducer of claim 3, wherein said conductive column comprises copper.

5. The phased array ultrasonic transducer of claim 1, wherein each of said plurality of bonding wire elements comprises a conductive cylinder comprising a first end coupled to a structural base.

6. The phased array ultrasonic transducer of claim 1, wherein each of said plurality of bonding wire elements comprises a conductive cone comprising a broad end coupled to a corresponding one of said plurality of ultrasonic transducers, and a narrow end coupled to said printed circuit board.

7. The phased array ultrasonic transducer of claim 1, wherein said damping material defines:
   a first face coupled to said plurality of ultrasonic transducers and to a membrane; and
   a second face opposite said first face and coupled to said printed circuit board.

8. A phased array ultrasonic transducer comprising:
   a bonding wire structure comprising a plurality of bonding wire elements formed by sequentially depositing a conductive material in layers on a structural base such that said plurality of bonding wire elements are arranged in a grid of bonding wire elements;
   a damping material extending across said bonding wire structure such that said bonding wire structure is surrounded and such that said damping material is interposed with said plurality of bonding wire elements, wherein said damping material defines a first face that is substantially parallel to the grid of bonding wire elements;
   a plurality of ultrasonic transducers arranged in a matrix beneath a membrane, each of said plurality of ultrasonic transducers is coupled to a corresponding one of said plurality of bonding wire elements by a contact, and wherein said membrane is laminated to said first face of said damping material;

wherein an entirety of the damping material is positioned below the plurality of ultrasonic transducers;

a filler material filling voids between the plurality of ultrasonic transducers and the damping material wherein the filler material includes the contact, such that each of said ultrasonic transducers is directly coupled to at least one of said plurality of bonding wire elements via the contact positioned within the filler material; and a printed circuit board comprising a plurality of circuits, each of said plurality of circuits coupled to a corresponding one of said plurality of bonding wire elements, said printed circuit board laminated to a second face of said damping material, said second face defined opposite said first face;

wherein the damping material is configured to absorb and attenuate ultrasonic energy.

9. The phased array ultrasonic transducer of claim 8, wherein said damping material comprises a curable resin.

10. The phased array ultrasonic transducer of claim 8, wherein said first face and said second face of said damping material are further defined by trimming of said damping material to predefined dimensions.

11. The phased array ultrasonic transducer of claim 8, wherein said bonding wire structure comprises a plurality of conductive cones, each conductive cone comprising a broad end coupled to a corresponding one of said plurality of ultrasonic transducers, and a narrow end coupled to said printed circuit board.

12. The phased array ultrasonic transducer of claim 8, wherein said printed circuit board comprises a flexible printed circuit board.

* * * * *